United States Patent [19]

Crombeen et al.

[11] 4,392,939

[45] Jul. 12, 1983

[54] MAGNETRON CATHODE SPUTTERING SYSTEM

[75] Inventors: Jacobus E. Crombeen; Petrus W. H. M. Crooymans; Jan Visser, all of Eindhoven, Netherlands

[73] Assignee: U.S. Philips Corporation, New York, N.Y.

[21] Appl. No.: 369,948

[22] Filed: Apr. 19, 1982

[30] Foreign Application Priority Data

Mar. 5, 1982 [NL] Netherlands ............... 8200902

[51] Int. Cl.³ ............................................. C23C 15/00
[52] U.S. Cl. ................................... 204/298; 204/192 E
[58] Field of Search .......................... 204/298, 192 E

[56] References Cited

U.S. PATENT DOCUMENTS 3,616,449 10/1971 Pellegrin ......................... 204/298
4,272,355  6/1981 Kennedy ......................... 204/298
4,274,476  6/1981 Garrett .......................... 204/298
4,297,190 10/1981 Garrett ........................ 204/192 E
4,341,810  7/1982 Lauterbach et al. ............ 204/298

OTHER PUBLICATIONS van Esdonk et al., Research/Development, Jan. 1975, pp. 41-44.

Primary Examiner—Arthur P. Demers
Attorney, Agent, or Firm—Robert J. Kraus

[57] ABSTRACT

In a magnetron cathode sputtering system the target (plate of material to be sputtered) 8 is held against a backing plate 13 by a vacuum, enabling the backing plate 13 to be reused. By providing the backing plate with a layer of soldering material which adheres to the backing plate 13, but does not adhere to the target 8, heat transfer between the two plates is improved.

4 Claims, 2 Drawing Figures

MAGNETRON CATHODE SPUTTERING SYSTEM

BACKGROUND OF THE INVENTION

The invention relates to a magnetron cathode sputtering system comprising in an envelope an anode and a flat cathode including a target, which is connected against a backing plate behind which means are provided to form a magnetic field near the target in the envelope. The target is a plate of material to be sputtered and is connected against a backing plate, which is a supporting plate for the target. Such systems are frequently used for providing thin films of material on substrates. During operation of the magnetron cathode sputtering system the substrate is placed in the envelope, the envelope being filled with a gas. By applying a sufficiently high potential between the anode and the cathode, a gas discharge is formed in which gas ions impinge on the target at high velocity and liberate the material therefrom (mainly atoms). This sputtered material is then captured by the substrate. By providing magnetic field lines near the target, which trap electrons, more ions are formed and hence the sputtering process is intensified. As a result of this the desired layer is formed more rapidly on the substrate. In such systems the target must be cooled to prevent the target from melting and to prevent the target from radiating too much heat. A magnetron cathode sputtering system of the kind mentioned in the opening paragraph is known from U.S. Pat. No. 4,204,936. The target according to the invention described in said Patent Specification is clamped against the backing plate by means of one or more magnets, the magnets cooperating with magnets present behind the backing plate. A disadvantage of such a device is that the clamping force per surface unit is low. Moreover the magnetic field for the target is adversely influenced. Such sputtering systems are used for the manufacture of optical information carriers in which a substrate, consisting of a thin plastic or glass disc in which the information is present in the form of a large number of pits, is covered with a thin metal film. In some devices the targets are connected to the backing plate via a soldered joint to produce a good mechanical and thermal contact. However, if the target is soldered to the backing plate it is very difficult to separate the target and backing plate from each other after sputtering in order that the backing plate can be used again. Moreover it is difficult in the case of large dimensions of the two plates to realize a uniformly soldered joint throughout the surface. British Pat. No. 1,311,042 discloses a high-frequency cathode sputtering system in which a target is secured against the backing plate by means of a screwed clamping ring. A material readily conducting thermal energy is provided between the target and the backing plate, for example a liquid metal or a metal paste. With such cooling it has also proved impossible to produce a uniform thermal contact between the target and the backing plate which is necessary for a magnetron cathode sputtering system. Moreover, seals must be provided to prevent the liquid metal from being disposed in the envelope.

SUMMARY OF THE INVENTION

It is an object of the invention to provide a magnetron cathode sputtering system in which the thermal contact between the target and the backing plate is uniform and in which the target can be simply held against the backing plate and can later be removed. A magnetron cathode sputtering system of the kind mentioned in the opening paragraph is characterized according to the invention in that the edge of the target is held against the edge of an aperture in the envelope in a gas-tight manner, the backing plate having a number of channels which comunicate with the contact face of the target, the backing plate being secured against the target by vacuum suction via the said channels. Because a comparatively low pressure (0.001 Torr) prevails in the envelope during the sputtering process it is necessary for the edge of the target to bear on the edge of the aperture in the envelope. By vacuum suction via the channels the backing plate is constantly pressed against the target as a result of the atmospheric pressure. Because the orifices of the channels can be regularly distributed over the contact face of the target and the backing plate, a very uniform pressure necessary for uniform heat transfer is obtained. The heat transfer can be further improved by providing the contact faces of the target and the backing plate with a thin layer of soldering material, which soldering material does not adhere to the target but does adhere to the backing plate, said soldering material having a melting temperature which is a few to a few tens of degrees above the operating temperature of the cathode. By passing boiling water through the cooling channels during the connection of the backing plate, the soldering material melts and after cooling adheres to the backing plate. Furthermore, as a result of the uniform and constant pressure it fills the space, if any, between the target and the backing plate entirely so that a very good heat transfer is obtained between the target and the backing plate which is from 8 to 10 times larger than the heat transfer when, for example, a heat conductive paste is used. An example of a suitable soldering material is Bi 50 Pb 26.7 Sn 13.3 Cd 10 or Bi 49 Pb 18 Sn 12 In 21 or Bi 34 In 66. In the sputtering system described in U.S. Pat. No. 4,204,936, a layer of soldering material is provided between the target and the backing plate to promote heat transfer. The backing plate is covered with a thin layer of nickel, so that the solder does not adhere to the backing plate. However, said nickel layer constitutes a disturbing short-circuit of the magnetic field. Moreover, in this system fresh soldering material must be provided each time, since the soldering material adheres to the target.

BRIEF DESCRIPTION OF THE DRAWING

The invention will now be described in greater detail, by way of example, with reference to a drawing, in which.

DESCRIPTION OF THE PREFERRED EMBODIMENT

Figure 1:
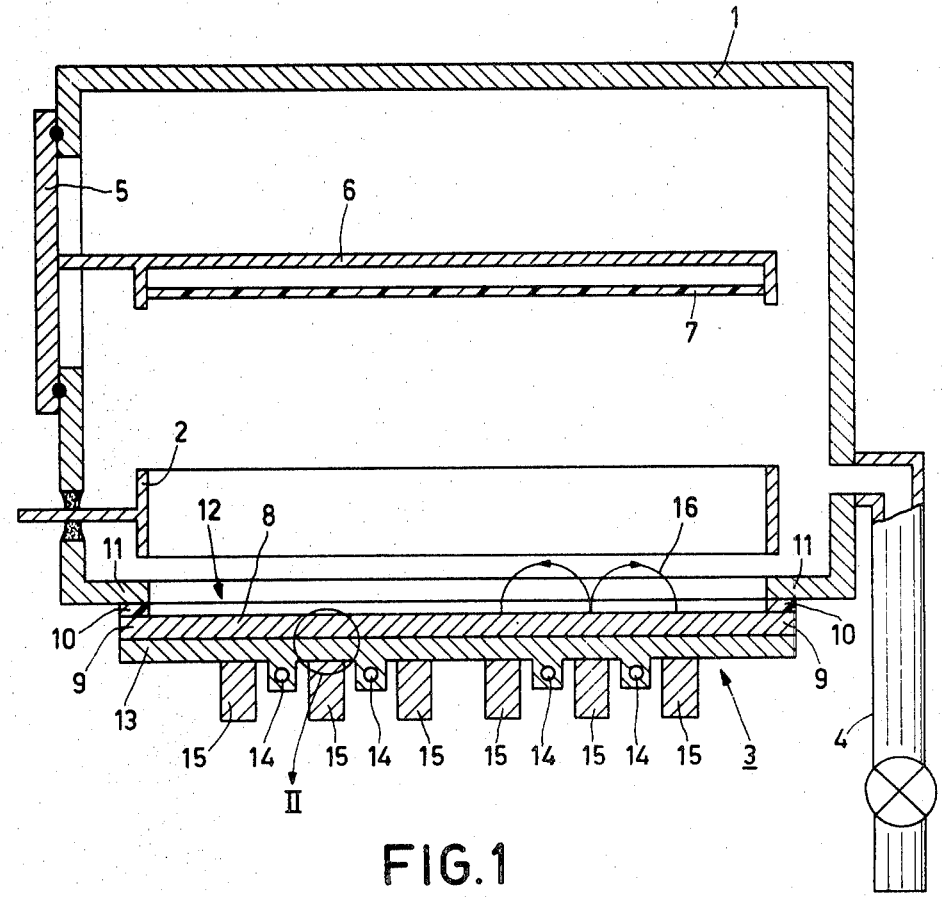
FIG. 1 is a diagrammatic sectional view of a magnetron cathode sputtering system according to the invention and FIG. 2 is a cross-sectional view of a detail of FIG. 1.

The magnetron cathode sputtering system as shown diagrammatically in FIG. 1 comprises in an envelope 1 an annular anode 2 and a cathode system 3. The envelope 1 can be evacuated via the exhaust tube 4 and can be filled with a gas (for example with argon). The envelope furthermore comprises a sluice 5 to which a holder 6 is connected for the sputtering substrate 7. The substrate is, for example a plastic disc-shaped record carrier as is used in the video-long-play (V.L.P.) system of N.

V. Philips' Gloeilampenfabrieken, which is described inter alia in Philips Techn. Rev. 33, 178-180, 1973, No. 7. The cathode system 3 consists, for example, of a 1 cm thick aluminium target 8 which forms the material to be sputtered. The edge 9 of target 8 is separated from the edge 11 of aperture 12 in the envelope 1 by means of a sealing ring 10 of an insulating material. The backing plate 13 connected against target 8 comprises a cooling duct 14 through which cooling liquid flows so as to dissipate the thermal energy originating from the target 8. A number of magnets 15 are connected against the backing plate 13 or generating magnetic field lines 16 near the surface of target 8. These field lines trap the electrons originating from the cathode which ionize the gas in the envelope close to the cathode. This increases the number of ions formed, which impinge on the target 8 intensifying, the sputtering process. As a result of this the target 8 becomes hotter than without the use of the magnets.

Figure 2:
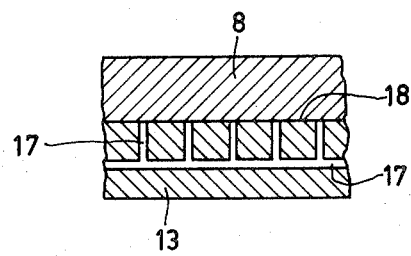

FIG. 2 is a sectional view of a detail of FIG. 1. The backing plate 13 comprises a large number of channels 17 communicating with the contact face 18 of target 8. By evacuating the channels 17 the backing plate 13 is uniformly brought into contact with plate 8 by suction so that good heat transfer is obtained over the whole contact face. This contact can be further improved by providing, a layer of soldering material between the target 8 and the backing plate 13, which solder adheres only to the backing plate 13. In FIG. 1 two annular field lines 16 are shown in front of the target 8 in the envelope. Of course more field lines or only one field line may be used. The filled line may also have a different shape. The field lines may also extend parallel to the surface of the target 8 and form a shield of magnetic field lines. The target and the backing plate are preferably circular, but they may also have a square, rectangular or any other desired shape.

What is claimed is:

1. A magnetron cathode sputtering system comprising, in an envelope, an anode and a flat cathode comprising a target in contact with a backing plate behind which means are provided to form a magnetic field near the target in the envelope, characterized in that the edge of the target is held against the edge of an aperture in the envelope in a gas-tight manner, said backing plate comprising a number of channels which communicate with the contact face of the target, the backing plate being held against the target by means of a vacuum in said channels.

2. A magnetron cathode sputtering system as claimed in claim 1, characterized in that the contact faces of the target and the backing plate are separated by a thin layer of soldering material which does not adhere to the target but does adhere to the backing plate, said soldering material having a melting temperature which is a few to a few tens of degrees above the operating temperature of the cathode.

3. A magnetron cathode sputtering system as claimed in claim 2, characterized in that the melting temperature of the soldering material is between 70° and 100° C.

4. A magnetron cathode sputtering system as claimed in claim 1, 2 or 3, characterized in that it is a system for coating disc-shaped record carriers with a light reflecting film.

* * * * *